United States Patent
Ye et al.

(10) Patent No.: US 10,741,481 B2
(45) Date of Patent: *Aug. 11, 2020

(54) INTEGRATED PACKAGE ASSEMBLY FOR SWITCHING REGULATOR

(71) Applicant: Silergy Semiconductor Technology (Hangzhou) LTD, Hangzhou, ZheJiang Province (CN)

(72) Inventors: Jiaming Ye, Hangzhou (CN); Xiaochun Tan, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/996,774

(22) Filed: Jun. 4, 2018

(65) Prior Publication Data
US 2018/0277470 A1    Sep. 27, 2018

Related U.S. Application Data (63) Continuation of application No. 14/601,098, filed on Jan. 20, 2015, now Pat. No. 10,043,738.

(30) Foreign Application Priority Data

Jan. 24, 2014  (CN) .......................... 2014 1 0035538
Jan. 24, 2014  (CN) .......................... 2014 1 0036423

(51) Int. Cl.
*H01L 23/495* (2006.01)
*H01L 23/00* (2006.01)

(52) U.S. Cl.
CPC .. *H01L 23/49575* (2013.01); *H01L 23/49562* (2013.01); *H01L 24/05* (2013.01); *H01L 24/32* (2013.01); *H01L 24/48* (2013.01); *H01L 24/49* (2013.01); *H01L 2224/05553* (2013.01); *H01L 2224/05554* (2013.01); *H01L 2224/32145* (2013.01); *H01L 2224/48091* (2013.01); *H01L 2224/48137* (2013.01); *H01L 2224/48145* (2013.01); *H01L 2224/48247* (2013.01);
(Continued)

(58) Field of Classification Search
None
See application file for complete search history.

(56) References Cited

U.S. PATENT DOCUMENTS

| 2003/0102489 A1 | 6/2003 | Nam et al. |
| 2004/0262774 A1 | 12/2004 | Kang et al. |

(Continued)

FOREIGN PATENT DOCUMENTS

| CN | 101241904 A | 8/2008 |
| CN | 101615609 A | 12/2009 |

*Primary Examiner* — Nilufa Rahim
(74) *Attorney, Agent, or Firm* — Michael C. Stephens, Jr.

(57) ABSTRACT

In one embodiment, an IC package assembly for a switching regulator, can include: a power switch chip including a control electrode and a first electrode on an obverse side and a second electrode on a reverse side, where the second electrode is configured as a switching terminal of a switching regulator; a control chip including a driving electrode and a plurality of input and output electrodes on the obverse side; and a leadframe including an extension pin, a substrate, and a plurality of discrete pins, where the extension pin is formed integrally with the substrate, and where the reverse side of the power switch chip is arranged on the substrate of the leadframe by a conductive material to electrically connect the second electrode to the substrate.

12 Claims, 10 Drawing Sheets

(52) U.S. Cl.
CPC ............... *H01L 2224/49171* (2013.01); *H01L 2924/0002* (2013.01); *H01L 2924/00014* (2013.01); *H01L 2924/13091* (2013.01)

(56) References Cited

U.S. PATENT DOCUMENTS

| | | |
|---|---|---|
| 2005/0275061 A1 | 12/2005 | Ohguro |
| 2009/0039869 A1 | 2/2009 | Williams |
| 2011/0134613 A1 | 6/2011 | Moussaoui |
| 2011/0298528 A1 | 12/2011 | Endo et al. |
| 2012/0322202 A1 | 12/2012 | Nishimura |
| 2013/0299957 A1 | 11/2013 | Kobayashi et al. |
| 2014/0231829 A1 | 8/2014 | Kanazawa et al. |

INTEGRATED PACKAGE ASSEMBLY FOR SWITCHING REGULATOR

RELATED APPLICATIONS

This application is a continuation of the following application, U.S. patent application Ser. No. 14/601,098, filed on Jan. 20, 2015, and which is hereby incorporated by reference as if it is set forth in full in this specification, and which also claims the benefit of Chinese Patent Application No. 201410036423.9, filed on Jan. 24, 2014, and of Chinese Patent Application No. 201410035538.6, also filed on Jan. 24, 2014, both of which are incorporated herein by reference in their entirety.

FIELD OF THE INVENTION

The present invention generally relates to the field of semiconductor packaging, and more particularly to an integrated circuit package assembly for a switching regulator.

BACKGROUND

With developments of miniaturization, lightweight, and multi-functionalization of electronic products, semiconductor package densities are further increasing. Both integrated circuit chips, as well as traditional discrete components (e.g., inductors) and power transistors can be included in a same semiconductor package. In such an integrated circuit package, the arrangement and connectivity among integrated circuit chips and discrete components are very important to the overall volume and performance of the integrated circuit package. In traditional integrated circuit package assembly for switching regulators, a voltage spike can easily occur on a switching pin of the integrated circuit package assembly that may interfere with adjacent pins to generate noise. Also, leakage current related failures can occur, and heat dissipation performance of the switching pin may be relatively poor.

SUMMARY

In one embodiment, an integrated circuit (IC) package assembly for a switching regulator, can include: (i) a power switch chip including a control electrode and a first electrode on an obverse side and a second electrode on a reverse side, where the second electrode is configured as a switching terminal of a switching regulator; (ii) a control chip including a driving electrode and a plurality of input and output electrodes on the obverse side; (iii) a leadframe including an extension pin, a substrate, and a plurality of discrete pins, where the extension pin is formed integrally with the substrate, and where the reverse side of the power switch chip is arranged on the substrate of the leadframe by a conductive material to electrically connect the second electrode to the substrate; and (iv) the control electrode being electrically connected to the driving electrode, and the plurality of input and output electrodes of the control chip are electrically connected to corresponding of the discrete pins.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
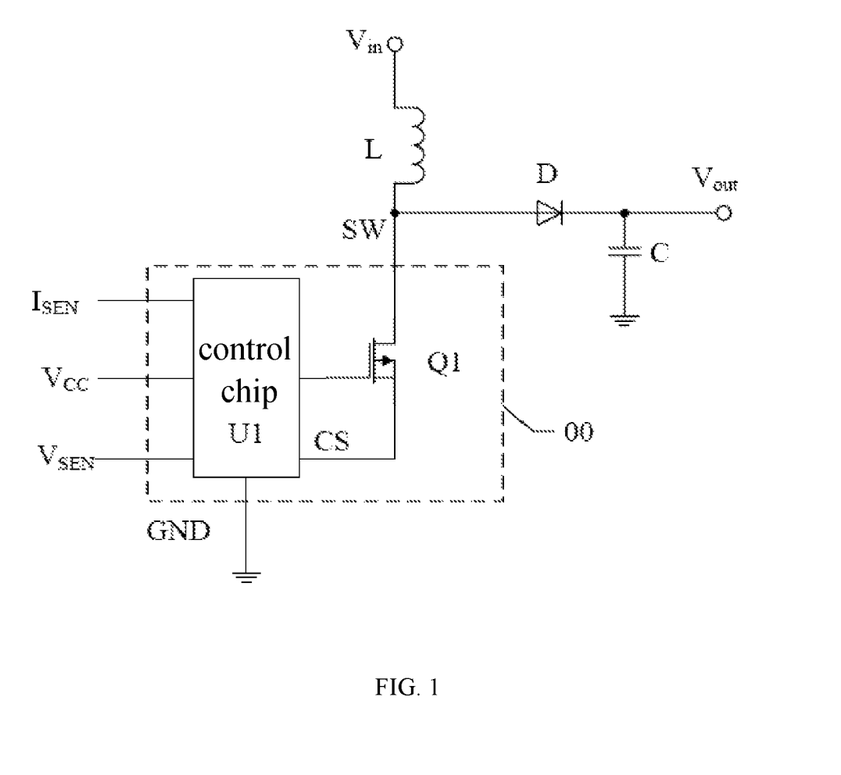
FIG. 1 is a schematic block diagram of an example switching regulator.

Referring now to FIG. 1, shown is a schematic block diagram of an example switching regulator. This example switching regulator can include control chip U1, power switch chip Q1, supply terminal VCC, ground terminal GND, current sensing terminal $I_{SEN}$, voltage sensing terminal $V_{SEN}$, and switching terminal SW. Switching terminal SW can be a common node between a power switch (e.g., Q1) and an inductor (e.g., L) of a power stage of the switching regulator.

Power switch chip Q1 can include a control electrode, a first electrode, and a second electrode. For example, the control electrode of Q1 can connect to a driving electrode from control chip U1. The second electrode can connect to an input voltage, and a first electrode can connect to ground. The on/off states of power switch (e.g., transistor) chip Q1 may be controlled by a switching control signal from the driving electrode of control chip U1, which can connect to the gate of transistor Q1. Control chip U1 can also include input/output electrode CS, which can connect to the first electrode (e.g., source or drain) of power switch chip Q1. Transistor Q1 can also be coupled to ground through control chip U1. The input and output electrodes of control chip U1 can correspondingly be coupled to the input and output terminals. Control chip U1 and power switch chip Q1 can be integrated into a single package 00 to form an integrated circuit (IC) package assembly for switching regulators.

Figure 2:
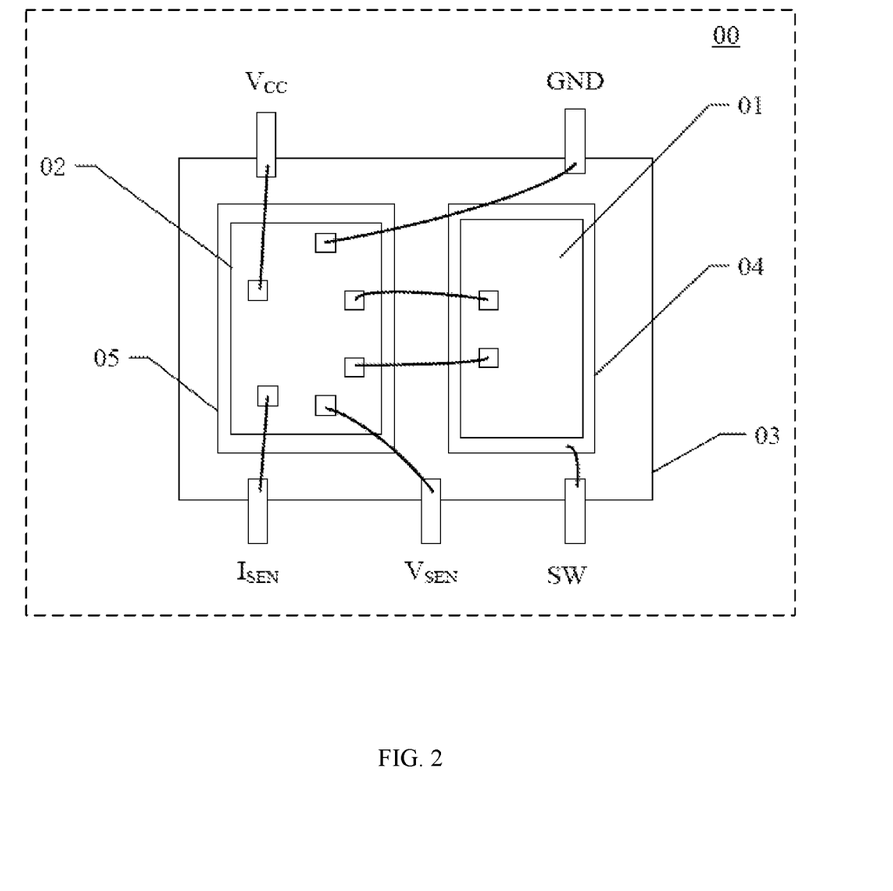
FIG. 2 is a diagram of an example integrated circuit package assembly for switching regulators.

Referring now to FIG. 2, shown is a diagram of an example integrated circuit package assembly for switching regulators. This example IC package assembly for switching regulators 00 can include power switch chip 01, control chip 02, package encapsulant 03, and a leadframe including discrete substrate 04, substrate 05, and a plurality of discrete pins. Power switch chip 01 can be arranged on substrate 04, and control chip 02 can be arranged on substrate 05. Also, a switching terminal can connect to switching pin SW of the leadframe through a bonding wire.

The input and output electrodes of control chip 02 can connect to supply pin VCC, ground pin GND, current sensing pin $I_{SEN}$, and voltage sensing pin $V_{SEN}$ through bonding wires. However, when a spike voltage is generated at switching pin SW, adjacent pins can be interfered with to generate noise. Also, the space among switching pin SW and adjacent pins may be relatively small, and may generate current leakage failures. Further, the heat dissipation performance of switching pin SW in this structure may be relatively poor.

In one embodiment, an integrated circuit (IC) package assembly for a switching regulator, can include: (i) a power switch chip including a control electrode and a first electrode on an obverse side and a second electrode on a reverse side, where the second electrode is configured as a switching terminal of a switching regulator; (ii) a control chip including a driving electrode and a plurality of input and output electrodes on the obverse side; (iii) a leadframe including an extension pin, a substrate, and a plurality of discrete pins, where the extension pin is formed integrally with the substrate, and where the reverse side of the power switch chip is arranged on the substrate of the leadframe by a conductive material to electrically connect the second electrode to the substrate; and (iv) the control electrode being electrically connected to the driving electrode, and the plurality of input and output electrodes of the control chip are electrically connected to corresponding of the discrete pins.

Figure 3:
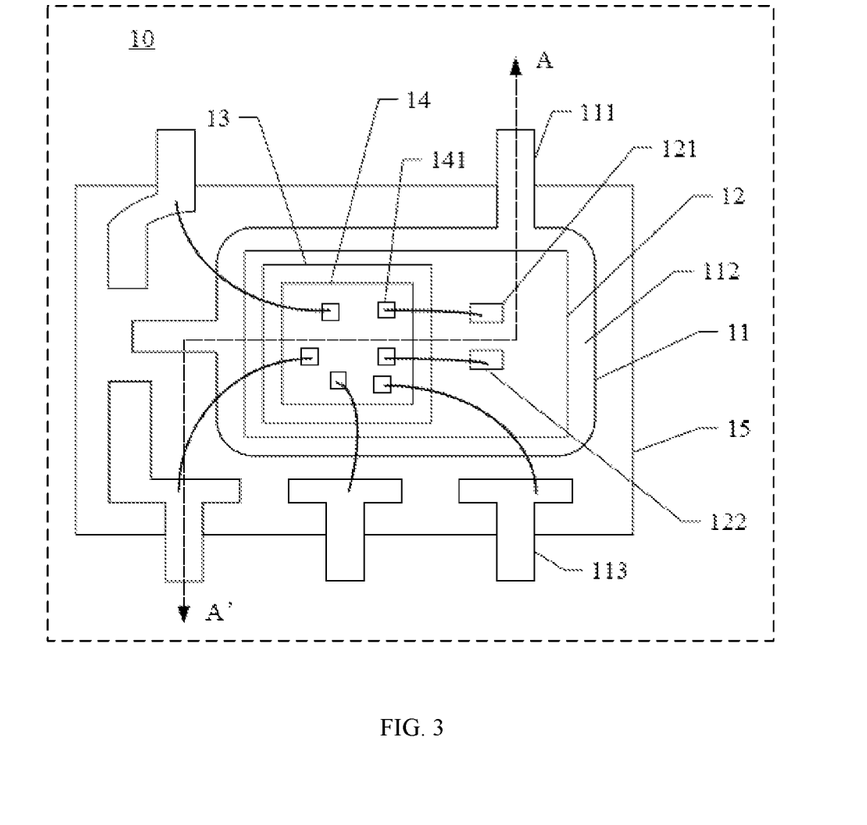
FIG. 3 is a diagram of a first example of an integrated circuit package assembly for switching regulators, in accordance with embodiments of the present invention.
Figure 4:
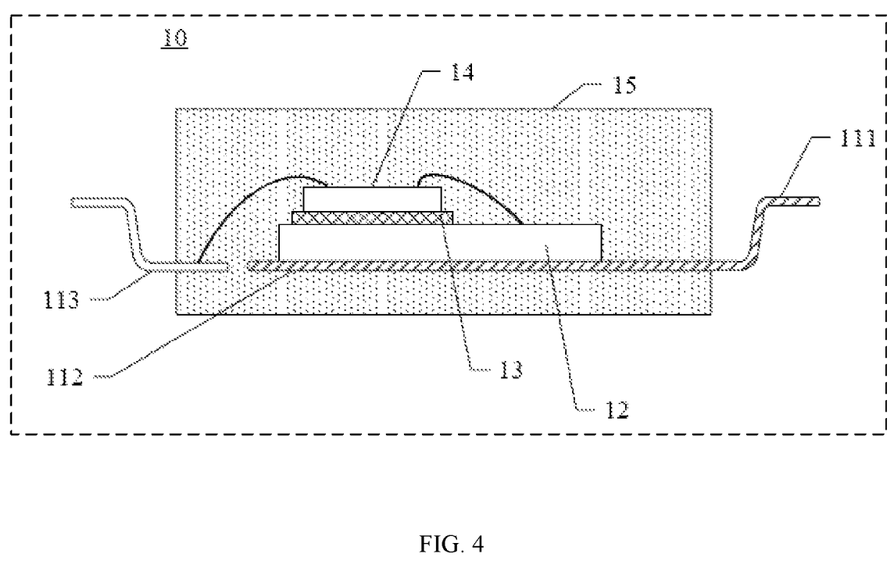
FIG. 4 is a sectional view diagram of the integrated circuit package assembly for switching regulators of FIG. 3, in accordance with embodiments of the present invention.

Referring now to FIG. 3, shown is a diagram of a first example of an integrated circuit package assembly for switching regulators, in accordance with embodiments of the present invention. FIG. 4 shows a sectional view of FIG. 3 along the line/path A-A'. Integrated circuit package assembly for switching regulators 10 can include leadframe 11, power switch chip 12, insulated isolation layer 13, control chip 14, and package encapsulant 15. For example, power switch chip 12 and control chip 14 can be stacked on leadframe 11. Integrated circuit assembly 10 can also include additional transistors or ICs. Further, substrate 112 can be as large as possible in a range defined by the package volume, in order to facilitate heat dissipation.

Leadframe 11 can include extension pin 111, substrate 112, and a plurality of discrete pins 113. Extension pin 111 can be integrally formed with substrate 112, and may be located relatively far away from discrete pins 113. For example, the space between extension pin 111 and adjacent discrete pins 113 may be at least as great as a space between two adjacent discrete pins 113. In order to achieve the arrangement of extension pin 111 relatively far away from discrete pins 113, discrete pins 113 can be arranged on a first side (A') and a second side (A), where the first and second sides that are opposite sides of the substrate. Also, the number of discrete pins 113 on the first side may be greater than that on the second side, and the difference between the two sides can be no less than 2.

As shown in FIG. 3, the integrated circuit package assembly applied for the switching regulator of FIG. 1 can include 5 pins. For example, leadframe 11 can include 4 discrete pins. For example, a first, a second, and a third discrete pin 113 are arranged on a first side of substrate 112, and the second discrete pin may be arranged between the first and the third discrete pins. The first and third discrete pins may be arranged on or near the ends of the first side of substrate 112, and the fourth discrete pin can be arranged on the second side opposite to the first discrete pin (e.g., toward a left side of FIG. 3).

Extension pin 111 can be arranged on the second side of substrate 112, and may be relatively far away from the discrete pins on the second side, which can extend outward from the second side. As shown in FIG. 3, extension pin 111 can be arranged opposite to third discrete pin 113, and the fourth discrete pin and extension pin 111 can be arranged on two ends of the second side of substrate 112. Therefore, the space between extension pin 111 and all discrete pins can be made as large as possible, in order to avoid possible noise interference to adjacent pins due to spike or transient voltages. In addition, possible failure due to current leakage can be substantially avoided with this approach.

For example, the first discrete pin can be a ground pin, the second discrete pin can be a supply pin, a third discrete pin can be a voltage sensing pin, the fourth discrete pin can be a current sensing pin, and the extension pin can be a switching pin. In one particular example, integrated circuit package assembly 10 shown in FIGS. 3 and 4 can be packaged as SOT23-5 with advantages of relatively small volume and size. Integrated circuit package assembly 10 can address potential problems of noise interference and failure of current leakage of other SOT23-5 packages. In one example application, integrated circuit package assembly for switching regulators 10 can be employed for light-emitting diode (LED) drivers to drive LED loads.

As described herein, and "electrode" can include a bonding pad, a "terminal" can be a circuit element connection or node, and a "pin" can include an external connection to the IC package assembly. As one skilled in the art will recognize, the number of discrete pins of integrated circuit package assembly 10, as well as the arrangement of extension pin 111 may not be limited to the above example. Rather, any other available pin arrangements, whereby the extension pin can be arranged relatively far away from other discrete pins can also be utilized in particular embodiments.

Power switch chip 12 can include control electrode 121 and first electrode 122 on the obverse (e.g., top) side, as well as a second electrode on the reverse (e.g., bottom) side. The second electrode is not shown in the drawings, but may be configured as a switching terminal of the integrated circuit package assembly for switching regulators. The switching terminal (e.g., SW) can be a common node between a power switch and an inductor of a power stage circuit of a switching regulator. Generally, the second electrode of power switch chip 12 configured as the switching terminal can be an electrode coupled to a high side of a voltage supply, and the first electrode of power switch chip 12 can be an electrode coupled to a low side (e.g., ground) of a voltage supply.

Power switch chip 12 can include any suitable transistors, such as MOSFET transistors or bipolar transistors. For example, control electrode 121 can be a gate of a power MOSFET transistor. When the type of the power MOSFET transistor is N-type, the second electrode arranged on the obverse side of power switch chip 12 and configured as the switching terminal can be a drain, and electrode 122 can be a source. When the type of the power MOSFET transistor is P-type, the second electrode arranged on the obverse side of power switch chip 12 and configured as the switching terminal can be a source, and electrode 122 can be a drain.

Control chip 14 can include driving electrode 141, and a plurality of input and output electrodes on the obverse side. In the example of FIG. 3, electrode 122 of power switch chip 12 can connect one input and output electrode of control chip 14 by bonding wires to couple first electrode 122 to ground through control chip 14. Of course, when power switch chip 12 is not to be coupled to ground through control chip 14, driving electrode 141 of control chip 14 can be coupled to control electrode 121 of power switch chip 12, and first electrode 122 of power switch chip 12 can be coupled to a corresponding discrete pin.

The reverse side of power switch chip 12 can connect to substrate 112 of leadframe 11 through a conductive material. Therefore, the second electrode configured as the switching terminal can be electrically coupled to substrate 112. For example, power switch chip 12 can be connected to substrate 112 by pasting a conductive adhesive, or by a soldering process. Extension pin 111 can be integrally formed with substrate 112. Therefore, the second electrode of power switch chip 12 can connect to extension pin 111 without bonding wires, and the associated resistance can be lower than bond wire connections would allow. In addition, the heat dissipation performance can be improved, and failure due to current leakage can be substantially avoided.

Control chip 14 can be stacked on power switch chip 12 through an insulated isolation layer 13. Also, control electrode 121 and first electrode 122 on the obverse side of power switch chip 12 can be exposed when control chip 14 is arranged to connect to corresponding input and output electrodes of control chip 14 through bonding wires. Control electrode 121 of power switch chip 12 can connect to driving electrode 141 through bonding wires. Also, the input and output electrodes of control chip 14 can be electrically coupled to corresponding discrete pins 113 through bonding wires.

Package encapsulant 15 with a permittivity higher than a predetermined value can be used to overlap and encapsulate control chip 14, power switch chip 12, and leadframe 11. Encapsulate 15 can also expose an end of pins from the package in order to accommodate electrical connection between integrated circuit package 10 and external circuitry. For example, a higher permittivity of packaging 15 can improve the insulation performance between the extension pin and discrete pins, in order to substantially avoid possible failures due to current leakage.

Figure 5:
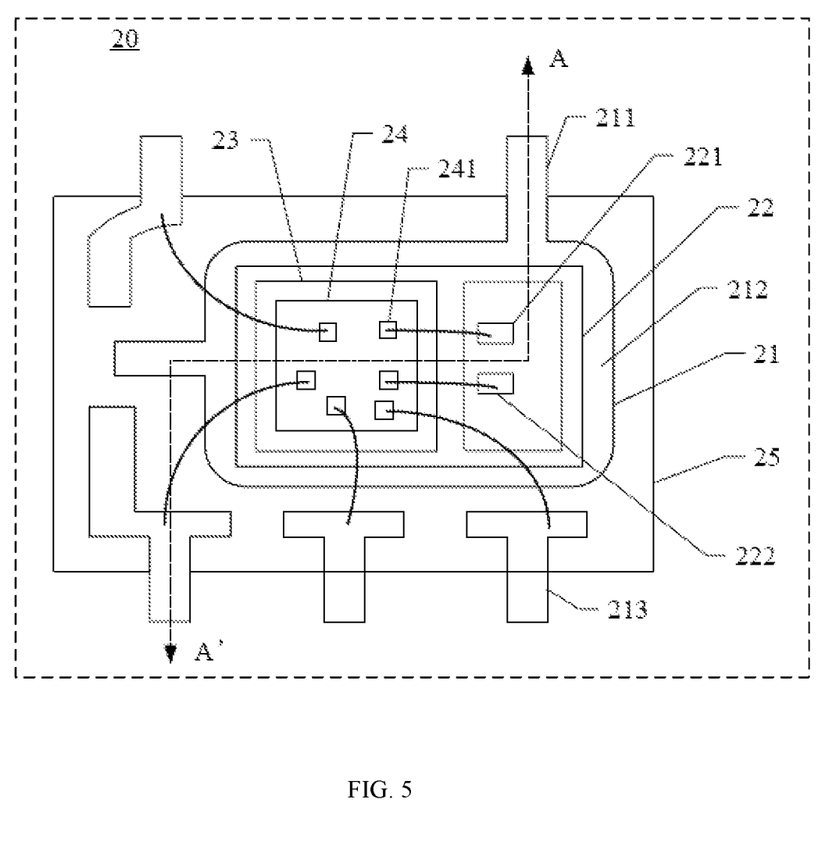
FIG. 5 is a diagram of a second example of an integrated circuit package assembly for switching regulators, in accordance with embodiments of the present invention.
Figure 6:
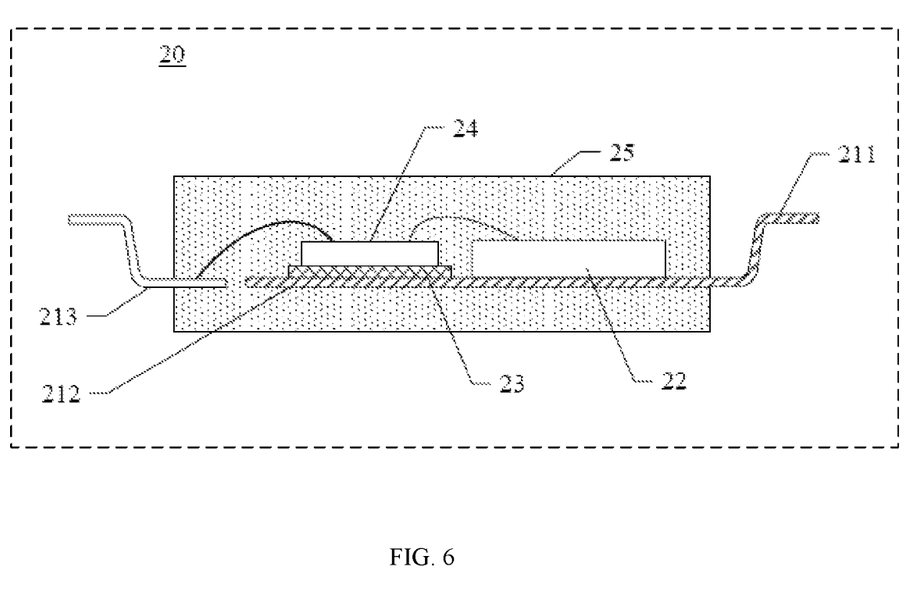
FIG. 6 is a sectional view diagram of the integrated circuit package assembly for switching regulators of FIG. 5, in accordance with embodiments of the present invention.

Referring now to FIG. 5, shown is a diagram of a second example of an integrated circuit package assembly for switching regulators, in accordance with embodiments of the present invention. FIG. 6 shows a sectional view diagram along the line/path A-A' of the integrated circuit package assembly for switching regulators of FIG. 5, in accordance with embodiments of the present invention. In this particular example, integrated circuit package assembly for switching regulators 20 can include leadframe 21, power switch chip 22, insulated isolated layer 23, control chip 24, and package encapsulant 25.

The integrated circuit package assembly for switching regulators 20 can further include additional transistors and/or ICs. In this example, the arrangement of leadframe 21 may be similar to that of the above example, and can include extension pin 211, substrate 212, and a plurality of discrete pins 213. Extension pin 211 can be integrally formed with substrate 212, and may be relatively far away from discrete pins 213. The space between extension pin 211 and adjacent discrete pins 213 may be at least as great as the space between two adjacent discrete pins 213.

Control chip 24 can include driving electrode 241, and a plurality of input and output electrodes on the obverse side. Different from the above example, control chip 24 may not be stacked on power switch chip 22. Rather, both control chip 24 and power switch chip 22 can be arranged on leadframe 21. The reverse side of power switch chip 22 may be pasted on substrate 212 by a conductive material, in order to electrically connect the second electrode on the reverse side of power switch chip 22 to substrate 212. The reverse side of control chip 24 can be pasted on substrate 212 by insulated isolation layer 23. Driving electrode 241 can be electrically connected to control electrode 221 of power switch chip 22 through bonding wires.

For example, first electrode 222 of power switch chip 22 can connect to one input/output electrode of control chip 24 through bonding wires to connect electrode 222 to ground through control chip 24. This connection may be utilized when power switch chip 22 is to be coupled to ground through control chip 24. Otherwise, control electrode 241 of control chip 24 can connect to driving electrode 221 of power switch chip 22. Also, first electrode 222 of power switch chip 22 can connect to corresponding discrete pin through bonding wires.

In this example, extension pin 211 connected to the second electrode configured as the switching terminal of the power switch chip can be integrally formed with the substrate of the leadframe to improve internal electrical connectivity, and the heat dissipation performance of the package assembly. In addition, extension pin 211 can be arranged relatively far away from other discrete pins 213, in order to decrease interference to discrete pins by the extension pin, and to avoid potential current leakage failures.

Figure 7:
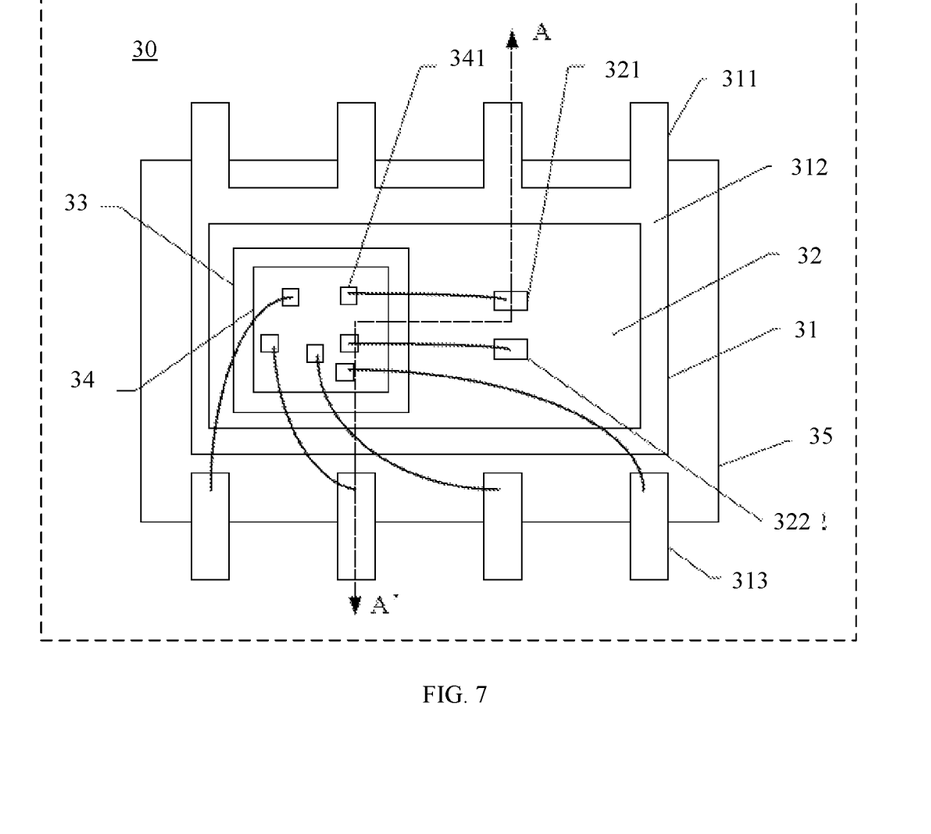
FIG. 7 is a diagram of a third example of an integrated circuit package assembly for switching regulators, in accordance with embodiments of the present invention.
Figure 8:
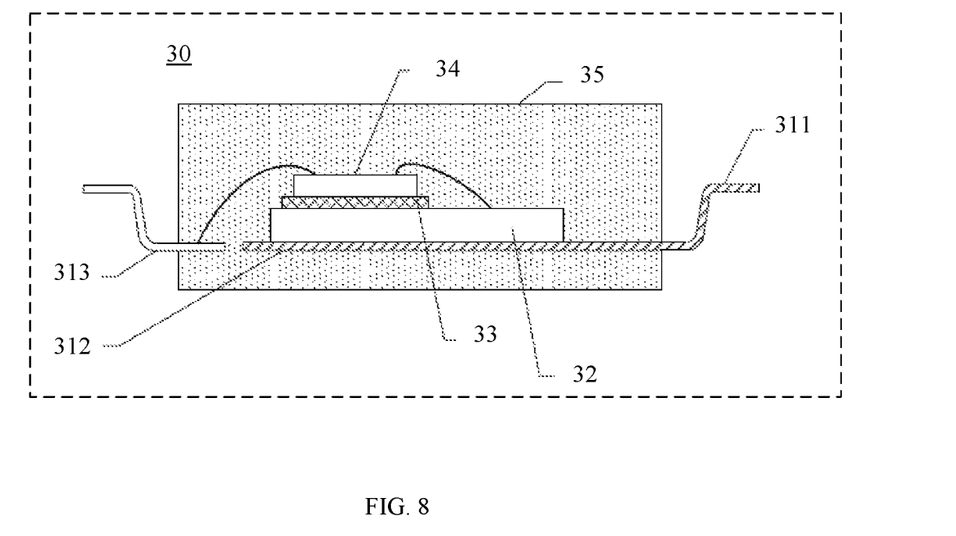
FIG. 8 is a sectional view diagram of the integrated circuit package assembly for switching regulators of FIG. 7, in accordance with embodiments of the present invention.

Referring now to FIG. 7, shown is a diagram of a third example of an integrated circuit package assembly for switching regulators, in accordance with embodiments of the present invention. FIG. 8 shows a sectional view diagram along the line/path A-A' of the integrated circuit package assembly for switching regulators of FIG. 7, in accordance with embodiments of the present invention. Integrated circuit package assembly 30 can include leadframe 31, power switch chip 32, insulated isolation layer 33, control chip 34, and package encapsulant 35. For example, power switch chip 32 and control chip 34 can be stacked on leadframe 31. Integrated circuit assembly 30 can further include other transistors and/or ICs.

Substrate 312 can be as large as possible in a range defined by the package volume, in order to facilitate heat dissipation. Leadframe 31 can include a plurality of extension pins 311, substrate 312, and a plurality of discrete pins 313. A plurality of extension pins 311 can be integrally formed with substrate 312, and may be arranged on a first side (side of A) of substrate 312. A plurality of discrete pins 313 can be arranged on a second side (side of A') of substrate 312. Also, the size of substrate 312 can be as large as possible within a scope as determined by the size of the package assembly.

For example, the number of extension pins 311 can be consistent with (e.g., the same as) that of discrete pins 313. For example, as shown in FIG. 7, leadframe 31 can include four extension pins and four discrete pins that are arranged on opposite sides of substrate 312. Therefore, extension pins 311 can be relatively far away from discrete pins 313, in order to avoid noise interference to adjacent pins generated by a spike/transition voltage, and to avoid potential current leakage failures. In addition, extension pins can be integrally formed with the substrate in order to increase the area of the portions of pins exposed from the package assembly, to increase the area of heat dissipation to improve heat dissipation performance.

For example, the integrated circuit package assembly 30 shown in FIGS. 7 and 8 can be packaged as an SOT8 with eight pins. Four pins on the first side can be configured as extension pins extending from the first side of substrate 312, and four pins on the second side can be configured as discrete pins that are not connected to substrate 312. For example, integrated circuit package assembly 10 can be employed for LED drivers to drive LED loads. Also, the number of discrete pins of integrated circuit package assembly 30 and the arrangement of the extension pin can be the same, or different numbers. Further, the extension pins and the discrete pins can be arranged symmetrically, or asymmetrically in some cases.

Power switch chip 32 can include control electrode 321 and electrode 322 on the obverse side, and a second electrode on the reverse side (which is not shown in drawings and configured as a switching terminal of the integrated circuit package assembly). The switching terminal can be a common node between a power switch and an inductor of a power stage circuit of a switching regulator. Generally, the second electrode of power switch chip 32 configured as the switching terminal can be an electrode coupled to a high side of a voltage supply, and the first electrode of power switch chip 12 can be an electrode coupled to a low side of a voltage supply.

Power switch chip 32 can be any suitable type of transistors, such as MOSFET transistors or bipolar transistors. Therefore, control electrode 321 can be a gate of a power MOSFET transistor. When the type of the power MOSFET transistor is N-type, the second electrode arranged on the obverse side of power switch chip 32 and configured as the switching terminal can be a drain, and first electrode 322 can be a source. When the type of the power MOSFET transistor is P-type, the second electrode arranged on the obverse side of power switch chip 32 and configured as the switching terminal can be a source, and first electrode 322 can be a drain.

Control chip 34 can include driving electrode 341 and a plurality of input and output electrodes on the obverse side. In the example of FIG. 7, electrode 322 of power switch chip 32 can connect one input/output electrode of control chip 34 by bonding wires to couple first electrode 322 to ground through control chip 34. This particular connection can be arranged when power switch chip 32 should be coupled to ground through control chip 34. When power switch chip 32 is not to be coupled to ground through control chip 34, driving electrode 341 of control chip 34 can be coupled to control electrode 321 of power switch chip 32, and electrode 322 of power switch chip 32 is coupled to a corresponding discrete pin.

The reverse side of power switch chip 32 can connect to substrate 312 of leadframe 31 through a conductive material. Therefore, the second electrode configured as the switching terminal can electrically connect to substrate 312. For example, power switch chip 32 can be connected to substrate 312 by pasting a conductive adhesive, or by soldering process. Extension pin 311 can be integrally formed with substrate 312. Therefore, the second electrode of power switch chip 32 can connect to extension pin 311 without bonding wires, and the resistance can be lower as compared to bonding wire connections. Thus, heat dissipation performance can be improved, and potential current leakage failures can be substantially avoided.

Control chip 34 can be stacked on power switch chip 32 through insulated isolation layer 33. Also control electrode 321 and first electrode 322 on the obverse side of power switch chip 32 may be exposed when control chip 34 is arranged to connect to corresponding input and output electrodes of control chip 34 through bonding wires. Control electrode 321 of power switch chip 32 can connect to driving electrode 341 through bonding wires. The input and output electrodes of control chip 34 can be electrically connected to corresponding discrete pins 313 through bonding wires.

Package encapsulant 35 with a permittivity higher than a predetermined value can be configured to overlap and encapsulate control chip 34, power switch chip 32, and leadframe 31. Packaging encapsulant 35 can expose the ends of pins to accommodate electrical connection between integrated circuit package 10 and external circuits (e.g., a printed-circuit board [PCB]). For example, a higher permittivity can improve the insulation performance between the extension pin and discrete pins, in order to avoid potential failure due to current leakage.

Figure 9:
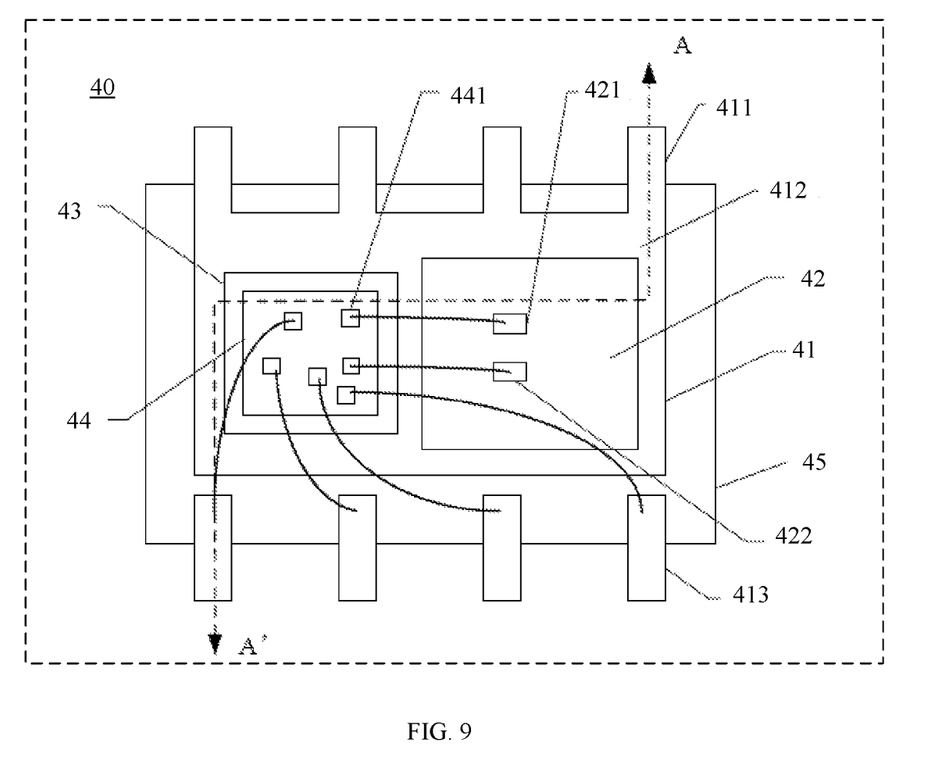
FIG. 9 is a diagram of a fourth example of an integrated circuit package assembly for switching regulators, in accordance with embodiments of the present invention.
Figure 10:
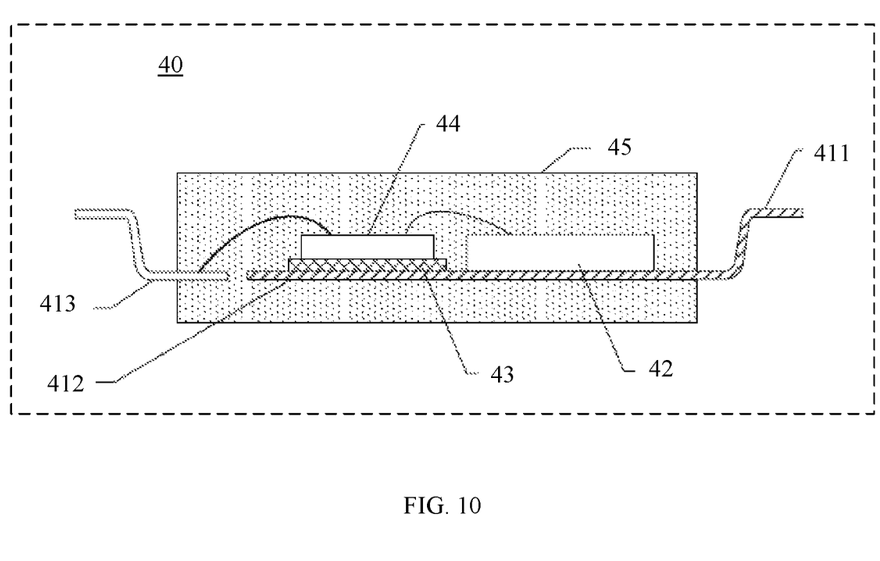
FIG. 10 is a sectional view diagram of the integrated circuit package assembly for switching regulators of FIG. 9, in accordance with embodiments of the present invention.

Referring now to FIG. 9, shown is a diagram of a fourth example of an integrated circuit package assembly for switching regulators, in accordance with embodiments of the present invention. Also, FIG. 10 shows a sectional view diagram along the line/path A-A' of the integrated circuit package assembly for switching regulators of FIG. 9, in accordance with embodiments of the present invention.

Similar with the examples above, integrated circuit package assembly for switching regulators 40 can include leadframe 41, power switch chip 42, insulated isolated layer 43, control chip 44, and package encapsulant 45. Integrated circuit package assembly 40 can also include additional transistors and/or ICs. In this example, the arrangement of leadframe 41 can include extension pin 411, substrate 412, and a plurality of discrete pins 413. Extension pin 411 can be integrally formed with substrate 412, and may be relatively far away from discrete pins 413. The space between extension pin 411 and adjacent discrete pins 413 can be at least as great as the space between two adjacent discrete pins 413.

Control chip 44 can include driving electrode 441 and a plurality of input and output electrodes on the obverse side. In this example, control chip 44 may not be stacked on power switch chip 42. Rather, both control chip 44 and power switch chip 42 can be arranged on leadframe 41. The reverse side of power switch chip 42 can be pasted on substrate 412 by a conductive material to electrically connect the second electrode on the reverse side of power switch chip 42 to substrate 412. The reverse side of control chip 44 can be pasted on substrate 412 by insulated isolation layer 43. Also, driving electrode 441 can be electrically connected to control electrode 421 of power switch chip 42 through bonding wires.

For example, first electrode 422 of power switch chip 42 can connect to one input/output electrode of control chip 44 through bonding wires to connect first electrode 422 to ground through control chip 44. This connection can be made when power switch chip 42 is to be coupled to ground through control chip 44. Otherwise, control electrode 441 of control chip 44 can connect to driving electrode 421 of power switch chip 42. First electrode 422 of power switch chip 42 can connect to corresponding discrete pin through bonding wires.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. An integrated circuit (IC) package assembly for a switching regulator, comprising:
   a) a power switch die comprising a control electrode and a first electrode on an obverse side and a second electrode on a reverse side, wherein said second electrode is configured as a switching terminal of said switching regulator;
   b) a control die comprising a driving electrode and a plurality of input and output electrodes on said obverse side;
   c) a leadframe comprising at least one extension pin that is all extension pins in said leadframe, a substrate, and a plurality of discrete pins, wherein said at least one extension pin is formed integrally with said substrate or other die supporting structure, and wherein said reverse side of said power switch die is arranged on said substrate of said leadframe by a conductive material to electrically connect said second electrode to said substrate;
   d) said control electrode being electrically connected to said driving electrode, and said plurality of input and output electrodes of said control die are electrically connected to corresponding of said discrete pins; and
   e) wherein at least two of said plurality of discrete pins are arranged on a first side of said substrate, said at least one extension pin is arranged only on a second side of said substrate, and only one of said plurality of discrete pins is located on said second side of said substrate.

2. The IC package assembly of claim 1, wherein a space between said at least one extension pin and adjacent of said plurality of discrete pins is not less than a space between an adjacent two of said plurality of discrete pins.

3. The IC package assembly of claim 1, wherein said control electrode comprises a gate electrode, said first electrode comprises a source electrode, and said second electrode comprises a drain electrode.

4. The IC package assembly of claim 1, wherein said control electrode comprises a gate electrode, said first electrode comprises a drain electrode, and said second electrode comprises a source electrode.

5. The IC package assembly of claim 1, wherein said leadframe comprises a first discrete pin, a second discrete pin, a third discrete pin, and a fourth discrete pin, and wherein:
   a) said first discrete pin, said second discrete pin, and said third discrete pin are arranged on said first side of said substrate, and said second discrete pin is arranged between said first discrete pin and said third discrete pin;
   b) said fourth discrete pin is arranged on said second side of said substrate and is opposite to said first discrete pin;
   c) said at least one extension pin is opposite to said third discrete pin; and
   d) said first side and said second side are opposite to each other.

6. The IC package assembly of claim 1, wherein said plurality of discrete pins comprises a ground pin, a voltage supply pin, a voltage sensing pin, and a current sensing pin, and said at least one extension pin comprises a switching pin.

7. The IC package assembly of claim 1, further comprising a package encapsulant that overlaps said control die, said power switch die, and said leadframe.

8. The IC package assembly of claim 7, wherein a portion of each of said at least one extension pin and said plurality of discrete pins are exposed from said package encapsulant.

9. The IC package assembly of claim 7, wherein a permittivity of said package encapsulant is higher than a predetermined value.

10. The IC package assembly of claim 1, wherein said reverse side of said control die is arranged on said power switch die by an insulated isolation layer.

11. The IC package assembly of claim 1, wherein said reverse side of said control die is arranged on said substrate.

12. The IC package assembly of claim 1, wherein said first electrode of said power switch die is electrically connected to one of said input and output electrodes of said control die.

* * * * *